United States Patent
Tajima et al.

(10) Patent No.: US 8,652,970 B2
(45) Date of Patent: Feb. 18, 2014

(54) VACUUM PROCESSING METHOD AND VACUUM PROCESSING APPARATUS

(75) Inventors: Yoshiyasu Tajima, Shizuoka (JP); Seiichi Takahashi, Shizuoka (JP); Kyuzo Nakamura, Kanagawa (JP)

(73) Assignee: Ulvac, Inc., Kanagawa (JP)

( * ) Notice: Subject to any disclaimer, the term of this patent is extended or adjusted under 35 U.S.C. 154(b) by 372 days.

(21) Appl. No.: 13/133,514

(22) PCT Filed: Mar. 24, 2010

(86) PCT No.: PCT/JP2010/055070
§ 371 (c)(1),
(2), (4) Date: Jun. 8, 2011

(87) PCT Pub. No.: WO2010/110309
PCT Pub. Date: Sep. 30, 2010

(65) Prior Publication Data
US 2011/0240600 A1    Oct. 6, 2011

(30) Foreign Application Priority Data

Mar. 26, 2009   (JP) ................................. 2009-076962

(51) Int. Cl.
*H01L 21/302* (2006.01)
*H01L 21/461* (2006.01)
*C03C 15/00* (2006.01)
*C03C 25/68* (2006.01)

(52) U.S. Cl.
USPC ................ 438/715; 134/1.2; 216/73; 216/79; 438/706; 438/723

(58) Field of Classification Search
USPC ......... 216/73, 79; 438/706, 715, 723; 134/1.2
See application file for complete search history.

(56) References Cited

U.S. PATENT DOCUMENTS

| | | | |
|---|---|---|---|
| 6,287,988 B1 | 9/2001 | Nagamine et al. | |
| 8,455,352 B1* | 6/2013 | Zheng et al. | 438/663 |
| 2005/0150455 A1* | 7/2005 | Kobayashi et al. | 118/715 |
| 2005/0150861 A1* | 7/2005 | Lee et al. | 216/2 |
| 2006/0157079 A1 | 7/2006 | Kim et al. | |
| 2006/0191877 A1 | 8/2006 | Shimizu et al. | |
| 2010/0041212 A1* | 2/2010 | Jinzu et al. | 438/478 |
| 2010/0167538 A1* | 7/2010 | Kim | 438/675 |
| 2010/0240218 A1* | 9/2010 | Ugajin | 438/706 |
| 2011/0151674 A1* | 6/2011 | Tang et al. | 438/715 |

FOREIGN PATENT DOCUMENTS

| | | |
|---|---|---|
| JP | 02-256235 A | 10/1990 |
| JP | 1988-080423 A | 11/1998 |

(Continued)

OTHER PUBLICATIONS

Hiroki Ogawa et al., "Dry Cleaning Technology for Removal of Silicon Native Oxide Employing Hot NH₃/NF₃ Exposure", Jpn. J. Appl. Phys., 2002, pp. 5349-5358, Part 1, vol. 41, No. 8.

*Primary Examiner* — Allan Olsen
*Assistant Examiner* — Margaret D Klunk
(74) *Attorney, Agent, or Firm* — Arent Fox LLP

(57) ABSTRACT

A processing gas is introduced to remove an oxide film on the surface of a silicon substrate 5. F radicals are allowed to act on the surface of the silicon substrate to etch a silicon layer. Then, $NH_3$ gas, $N_2$ gas and $NF_3$ gas are introduced, allowing $NH_xF_y$ to act on the oxidized surface of the silicon substrate 5, thereby forming $(NH_4)_2SiF_6$. The resulting $(NH_4)_2SiF_6$ is sublimated to remove by-products (SiOF, SiOH) on the surface of the silicon substrate 5.

10 Claims, 15 Drawing Sheets

(56) References Cited

FOREIGN PATENT DOCUMENTS

| JP | 2981243 B2 | 9/1999 |
| JP | 2001-053055 A | 2/2001 |
| JP | 2003-309105 A | 10/2003 |
| JP | 2005-203404 A | 7/2005 |
| JP | 2006-270030 A | 10/2006 |
| JP | 2007-538397 A | 12/2007 |
| JP | 2008-205452 A | 9/2008 |

* cited by examiner

FIG.7
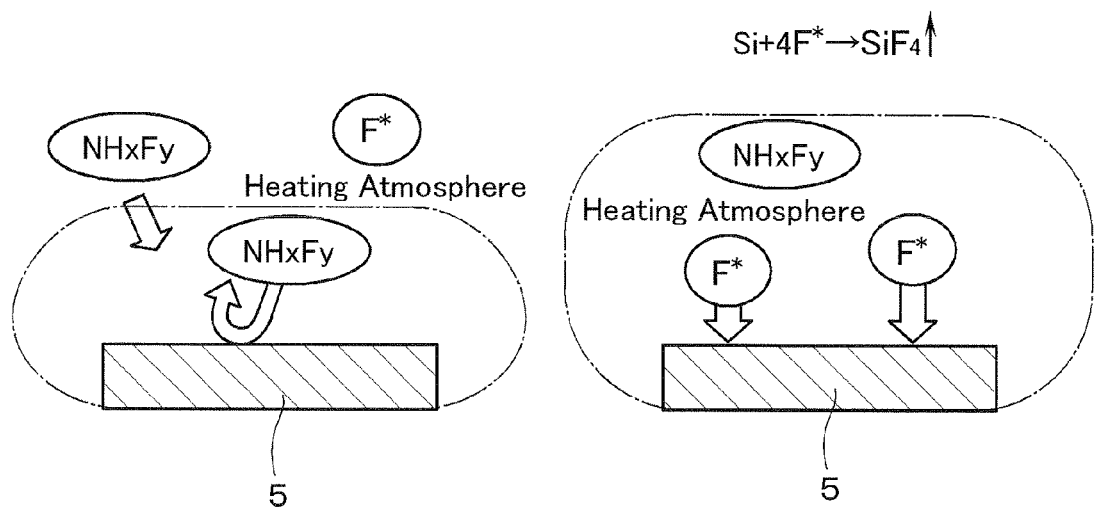
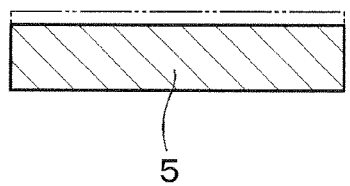

FIG.9
(a)
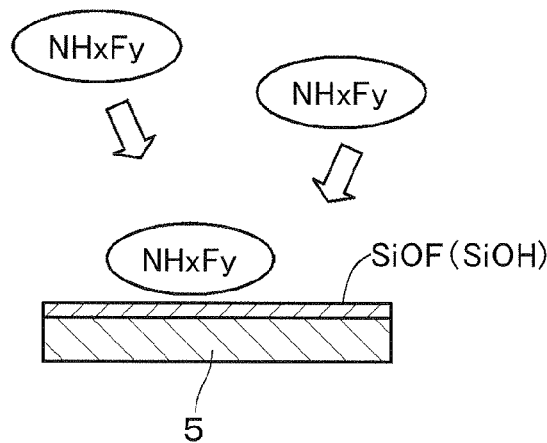
(b)
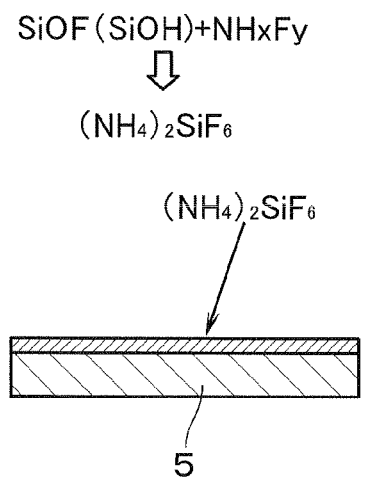
(c)
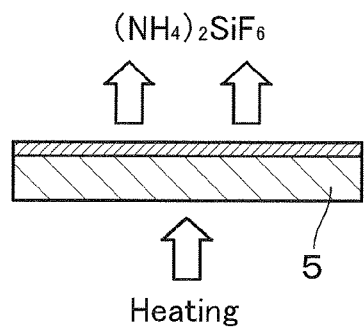
(d)
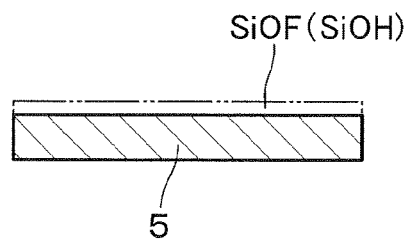

FIG.14
(a)
(b)
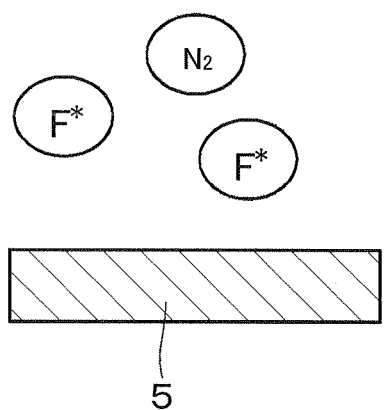
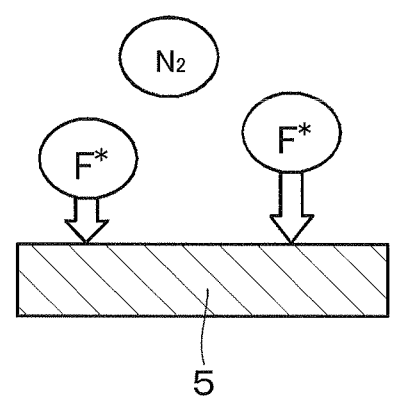
(c)
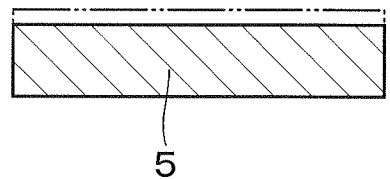

VACUUM PROCESSING METHOD AND VACUUM PROCESSING APPARATUS

CROSS-REFERENCE TO RELATED APPLICATION

This application is a National Stage entry of International Application No. PCT/JP2010/055070, filed Mar. 24, 2010, which claims priority to Japanese Patent Application No. 2009-076962, filed Mar. 26, 2009 the disclosure of the prior applications are incorporated in its entirety by reference

TECHNICAL FIELD

This invention relates to a vacuum processing method and a vacuum processing apparatus f or performing processing with process ing equipment in a vacuum state, for example, performing etching.

BACKGROUND ART

In a process for producing a semiconductor device, it is necessary, for example, to remove a native or natural oxide film (e.g., $SiO_2$) formed on a wafer at the bottom of a contact hole of a semiconductor substrate (semiconductor wafer). As a technology for removing the natural oxide film, various proposals have been made for the technology using hydrogen in the radical state (H*) and $NF_3$ gas (see, for example, Patent Document 1).

With the technology disclosed in Patent Document 1, a processing gas is introduced into a processing chamber rendered in a predetermined vacuum state to react the processing gas with an oxidized surface of a silicon wafer ($SiO_2$) disposed in an atmosphere in the predetermined vacuum state, thereby forming a reaction product $(NH_4)_2SiF_6$. Then, the processing chamber is heated to control the silicon substrate to a predetermined temperature. As a result, the $(NH_4)_2SiF_6$ is sublimated to remove the natural oxide film on the surface of the silicon substrate (etching).

In recent years, there has been a growing demand for the degree of cleanliness of the surface of the silicon wafer (single crystal silicon, polysilicon) deprived of the natural oxide film. Along this line, further purity has been demanded for the silicon surface after removal of the natural oxide film. On the silicon surface as an interface with the natural oxide film, oxygen may be present in interstitial spaces of the silicon. Even after removal of the natural oxide film, it is likely for oxygen to remain.

PRIOR ART DOCUMENTS

Patent Documents

Patent Document 1: JP-A-2005-203404

SUMMARY OF THE INVENTION

Problems to be Solved by the Invention

The present invention has been accomplished in the light of the above-described circumstances. It is an object of the invention to provide a vacuum processing method and a vacuum processing apparatus which can reliably remove oxygen on the surface of a substrate after removal of a natural oxide film, and can remove by-products likely to be formed by oxygen removal, with the use of a processing apparatus for removing the natural oxide film.

Means for Solving the Problems

A vacuum processing method of the present invention according to a first aspect, designed to attain the above object, comprises: introducing a processing gas to react the processing gas with an oxidized surface of a silicon substrate disposed in an atmosphere in a predetermined vacuum state, thereby forming a reaction product, and controlling the silicon substrate to a predetermined temperature to sublimate the reaction product and remove an oxide film on a surface of the silicon substrate; in a state where arrangement of the silicon substrate having the oxide film removed therefrom is maintained, introducing an auxiliary processing gas to allow F radicals to act on the surface of the silicon substrate, thereby removing a silicon layer of a predetermined thickness; and after removing the silicon layer, removing a by-product on the surface of the silicon substrate which has been formed during removal of the silicon layer.

With the present invention according to the first aspect, the surface layer of the silicon substrate after removal of the natural oxide film is removed by a predetermined thickness by means of the auxiliary processing gas. In this manner, after the natural oxide film is removed, oxygen on the surface of the substrate can be reliably removed. Furthermore, the by-product which may occur upon removal of oxygen can also be removed.

A vacuum processing method of the present invention according to a second aspect is the vacuum processing method according to the first aspect, further comprising introducing the processing gas to react the processing gas with the by-product on the surface of the silicon substrate having the silicon layer removed therefrom, thereby forming a reaction by-product, and then controlling the silicon substrate to a predetermined temperature to sublimate the reaction by-product and remove the by-product on the surface of the silicon substrate.

With the present invention according to the second aspect, the surface layer of the silicon substrate after removal of the natural oxide film is removed by a predetermined thickness by means of the auxiliary processing gas. With the use of a processing apparatus for removing the natural oxide film, oxygen on the surface of the substrate can be reliably removed after the natural oxide film is removed. Furthermore, the by-product which may occur upon removal of oxygen can also be removed.

A vacuum processing method of the present invention according to a third aspect is the vacuum processing method according to the second aspect, further comprising removing the by-product on the surface of the silicon substrate, while maintaining arrangement of the silicon substrate having the silicon layer removed therefrom.

With the present invention according to the third aspect, actions up to the removal of the by-product which may occur upon removal of oxygen can be performed using a processing apparatus for removing the natural oxide film.

A vacuum processing method of the present invention according to a fourth aspect is the vacuum processing method according to either the second or the third aspects, wherein the processing gas is at least one of $NH_3$ and $H_2$, $N_2$, and $NF_3$, the reaction product and the reaction by-product are sublimated in an atmosphere at 100° C. to 400° C., and the processing gas is introduced, or $N_2$ and $NF_3$ are introduced, as the auxiliary processing gas to allow the F radicals to act on the surface of the silicon substrate.

With the present invention according to the fourth aspect, the processing gas is introduced, or $N_2$ and $N_3$ are introduced, as the auxiliary processing gas to allow the F radicals to act on the surface of the silicon substrate.

A vacuum processing method of the present invention according to a fifth aspect is the vacuum processing method according to the fourth aspect, wherein the auxiliary processing gas is introduced from the same gas introduction means.

With the present invention according to the fifth aspect, the auxiliary processing gas is introduced with the use of the same gas introduction means, thereby allowing the F radicals to act on the surface of the silicon substrate.

A vacuum processing method of the present invention according to a sixth aspect is the vacuum processing method according to the first aspect, wherein the by-product on the surface of the silicon substrate is removed using an anhydrous hydrofluoric acid gas (AHF), $N_2$ gas, and $N_2$ gas saturated with ethanol ($C_2H_5OH$) or methanol ($CH_3OH$).

With the present invention according to the sixth aspect, an anhydrous hydrofluoric acid gas (AHF), $N_2$ gas, and $N_2$ gas saturated with ethanol ($C_2H_5OH$) or methanol ($CH_3OH$) by bubbling ethanol ($C_2H_5OH$) or methanol ($CH_3OH$) are introduced, whereby the by-product on the surface of the silicon substrate can be removed.

A vacuum processing method of the present invention according to a seventh aspect is the vacuum processing method according to claim 1, wherein after the silicon layer is removed, the by-product on the surface of the silicon substrate is removed using a wet etching process.

A vacuum processing method of the present invention according to an eighth aspect is the vacuum processing method according to the seventh aspect, wherein hydrogen fluoride (HF) is used as a solution for the wet etching process.

With the present invention according to the seventh and eighth aspects, the surface layer of the silicon substrate after removal of the natural oxide film is removed by a predetermined thickness. In this manner, after the natural oxide film is removed, oxygen on the surface of the substrate can be reliably removed. Moreover, the by-product which may occur upon removal of oxygen can also be removed.

A vacuum processing method of the present invention according to a ninth aspect is the vacuum processing method according to any the first through eighth aspects, wherein the by-product is SiOF.

With the present invention according to a ninth aspect, SiOF which is the by-product formed on the surface of the silicon substrate can be reliably removed.

A vacuum processing method of the present invention according to a tenth aspect comprises: introducing at least one of $NH_3$ and $H_2$, $N_2$, and $NF_3$, as a processing gas to react the processing gas with an oxidized surface of a silicon substrate disposed in an atmosphere in a predetermined vacuum state, thereby forming a reaction product; controlling the silicon substrate to a predetermined temperature to sublimate the reaction product and remove an oxide film on a surface of the silicon substrate and, in a state where arrangement of the silicon substrate having the oxide film removed therefrom is maintained, introducing the processing gas, or $N_2$ and $NF_3$, as an auxiliary processing gas through gas introduction means identical with that for the processing gas to allow F radicals to act on the surface of the silicon substrate, thereby removing a silicon layer of a predetermined thickness; and then in a state where the arrangement of the silicon substrate is maintained, removing a by-product on the surface of the silicon substrate, which has been formed during removal of the silicon layer, by controlling the silicon substrate to 100° C. to 400° C.

With the present invention according to the tenth aspect, the surface layer of the silicon substrate after removal of the natural oxide film is removed by a predetermined thickness by means of the auxiliary processing gas. In this manner, after the natural oxide film is removed, oxygen on the surface of the substrate can be reliably removed. Moreover, the by-products which may occur upon removal of oxygen can also be removed. The actions up to the removal of the by-product which may occur upon removal of oxygen can be performed using a processing apparatus for removing the natural oxide film. The processing gas is introduced, or $N_2$ and $NF_3$ are introduced, as the auxiliary processing gas to allow F radicals to act on the surface of the silicon substrate. The auxiliary processing gas is introduced with the use of the same gas introduction means, thereby allowing the F radicals to act on the surface of the silicon substrate.

A vacuum processing apparatus of the present invention according to an eleventh aspect, designed to attain the aforementioned object, is a vacuum processing apparatus, comprising: processing equipment where a substrate is disposed and whose interior is brought into a predetermined vacuum state; first processing gas introduction means for introducing a first processing gas or an auxiliary processing gas into the processing equipment; second processing gas introduction means for introducing a second processing gas, which reacts with the first processing gas or the auxiliary processing gas, into the processing equipment; temperature control means for controlling the interior of the processing equipment to a predetermined temperature, thereby reacting the first processing gas, the second processing gas, and a natural oxide film on a surface of the substrate, while reacting the first processing gas, the second processing gas, and a by-product on the surface of the substrate; and control means for controlling the first processing gas introduction means, the second processing gas introduction means, and the temperature control means, thereby applying predetermined processings to the surface of the substrate, wherein the control means controls introduction of the first processing gas and the second processing gas, and controls the temperature control means, thereby reacting the first processing gas, the second processing gas, and the natural oxide film on the surface of the substrate to form a reaction product, and removing the reaction product, controls introduction of the first processing gas, the auxiliary processing gas, and the second processing gas, thereby removing a surface layer of the substrate, from which the natural oxide film has been removed, by a predetermined thickness by means of the auxiliary processing gas and the second processing gas, or by means of the auxiliary processing gas, and controls introduction of the first processing gas and the second processing gas, and controls the temperature control means, thereby reacting the first processing gas, the second processing gas, and the by-product on the surface of the substrate having the surface layer removed therefrom, to form a reaction by-product, and removing the reaction by-product.

With the present invention according to the eleventh aspect, after the natural oxide film of the substrate is removed, the auxiliary processing gas is introduced from both of the first processing gas introduction means and the second processing gas introduction means by the control means. By the action of the control means, the surface layer of the substrate after removal of the natural oxide film is removed by a predetermined thickness by means of the auxiliary processing gas. Furthermore, the introduction of the first processing gas and the second processing gas is controlled, and the temperature control means is controlled, whereby the first processing gas, the second processing gas, and a by-product on the surface of the substrate having the surface layer removed therefrom are reacted to form a reaction by-product, and the resulting reaction by-product is removed. Thus, with the use of the processing apparatus for removing the natural oxide film, oxygen on the surface of the substrate can be reliably removed after the natural oxide film is removed. Besides, the by-product which may occur upon removal of oxygen can also be removed.

A vacuum processing apparatus of the present invention according to a twelfth aspect is the vacuum processing apparatus according to the eleventh aspect, wherein a plurality of the substrates are accommodated inside the processing equipment, and the plurality of the substrates are arranged parallel to each other at predetermined intervals.

With the present invention according to the twelfth aspect, the removal of the natural oxide film, the removal of the surface layer of the substrate having the natural oxide film removed therefrom, and the removal of the by-product can be performed by batch processing.

A vacuum processing apparatus of the present invention according to a thirteenth aspect is the vacuum processing apparatus according to the eleventh aspect, wherein one of the substrates is accommodated inside the processing equipment.

With the present invention according to the thirteenth aspect, the removal of the natural oxide film, the removal of the surface layer of the substrate having the natural oxide film removed therefrom, and the removal of the by-product can be performed by single wafer processing.

A plurality of processing chambers can be provided as processing equipment and, for example, the step of removing the surface layer of the substrate after removal of the natural oxide film by a predetermined thickness by means of the auxiliary processing gas can be carried out in the independent processing chamber. In this case, the first processing gas introduction means and the second processing gas introduction means are provided, respectively, for the plurality of processing chambers. Also, as the processing equipment, a heating chamber and a cooling chamber for exercising temperature control can be independently provided, and a processing chamber for performing the carrying-in and carrying-out of the substrate can be independently provided. By providing a mechanism for simultaneously moving a plurality of substrates, it is possible to provide a plurality of processing chambers for processing equipment in batch processing.

A vacuum processing apparatus of the present invention according to a fourteenth aspect is the vacuum processing apparatus according to any the eleventh through thirteenth aspects, wherein the first processing gas is a gas for generating H radicals, the second processing gas is a gas for generating $NH_xF_y$ and F radicals, and the substrate is a silicon substrate.

A vacuum processing apparatus of the present invention according to a fifteenth aspect is the vacuum processing apparatus according to the fourteenth aspect, wherein the first processing gas is at least one of $NH_3$ and $H_2$ and $N_2$, the second processing gas is $NF_3$, and the control means controls the temperature control means such that a temperature of the silicon substrate becomes a predetermined temperature, thereby reacting the first processing gas, the second processing gas, and the natural oxide film to form a reaction product, and sublimating the reaction product to remove the natural oxide film from the surface of the silicon substrate; allows the F radicals, by means of the auxiliary processing gas and the second processing gas, or the auxiliary processing gas, to act on the surface of the silicon substrate from which the natural oxide film has been removed, thereby removing a silicon layer of the silicon substrate by a predetermined thickness, and controls the temperature control means such that a temperature of the silicon substrate becomes a predetermined temperature, thereby reacting the first processing gas, the second processing gas, and the by-product to form a reaction by-product, and sublimating the reaction by-product to remove the by-product from the surface of the silicon substrate.

With the present invention according to the fourteenth and fifteenth aspects, the first processing gas, the second processing gas, and the oxide film on the surface of the silicon substrate (silicon wafer) are reacted to form a reaction product. The silicon wafer is controlled to the predetermined temperature to sublimate the reaction product, thereby removing (etching) the natural oxide film on the surface of the silicon wafer. F radicals are allowed to act on the surface of the silicon wafer to remove the silicon layer by a predetermined thickness. The first processing gas, the second processing gas, and a by-product are reacted to form a reaction by-product. By controlling the silicon wafer to a predetermined temperature, the reaction by-product can be sublimated to remove (etch) the by-product on the surface of the silicon wafer.

A vacuum processing apparatus of the present invention according to a sixteenth aspect is the vacuum processing apparatus according to the fifteenth aspect, wherein the auxiliary processing gas is at least one of $NH_3$ and $H_2$ and $N_2$.

With the present invention according to the sixteenth aspect, the processing gas is introduced as the auxiliary processing gas, whereby F radicals can be allowed to act on the surface of the silicon substrate.

A vacuum processing apparatus of the present invention according to a seventeenth aspect is the vacuum processing apparatus according to the sixteenth aspect, wherein the control means is equipped with stopping means for stopping one or both of $NH_3$ and $H_2$ as the auxiliary processing gas, and introducing only $N_2$, or for introducing $N_2$ and $NF_3$, in allowing the F radicals to act.

With the present invention according to the seventeenth aspect, the auxiliary processing gas can be provided, with one or both of $NH_3$ and $H_2$ as the first processing gas being stopped.

Effects of the Invention

The vacuum processing method and vacuum processing apparatus of the present invention use a processing apparatus for removing the natural oxide film and, after removal of the natural oxide film, can reliably remove oxygen on the surface of the substrate, and can also remove the by-product which may occur upon removal of oxygen.

BRIEF DESCRIPTION OF THE DRAWINGS

[FIGS. 7(a) to 7(c)] are process explanation drawings showing the removal of the silicon layer.

[FIGS. 9(a) to 9(d)] are process explanation drawings showing the removal of a by-product.

[FIGS. 14(a) to 14(c)] are process explanation drawings showing the removal of the silicon layer.

MODES FOR CARRYING OUT THE INVENTION

A first embodiment of the present invention will be described based on FIG. 1 to FIG. 12.

Figure 1:
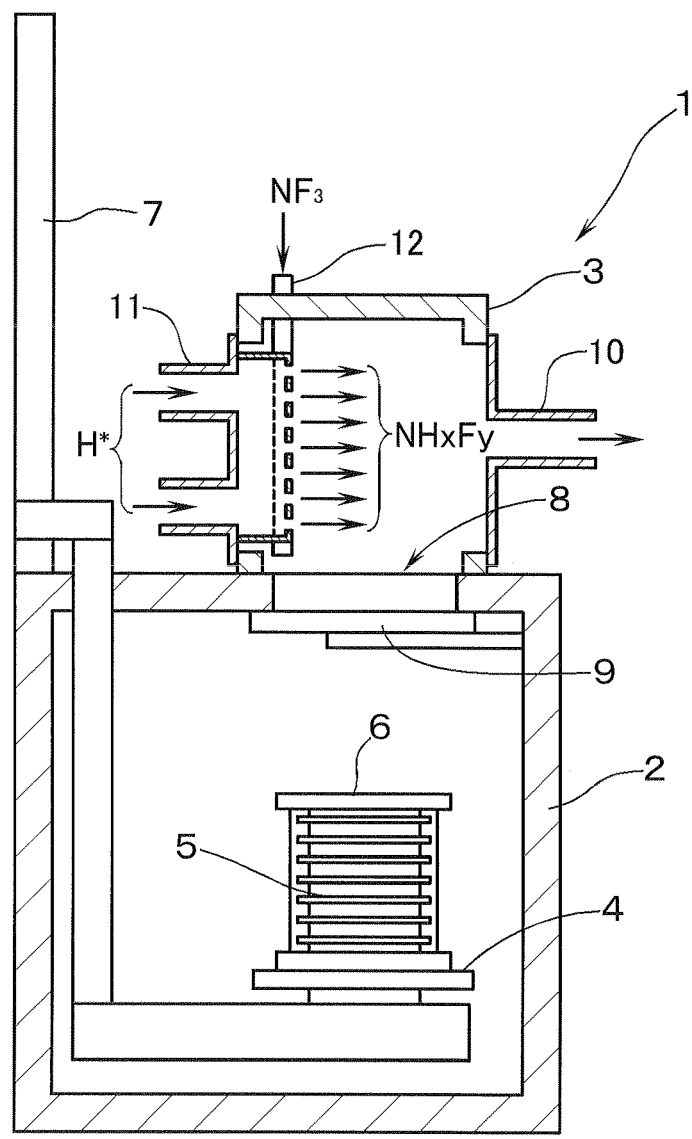
[FIG. 1] is an overall configuration drawing of a vacuum processing apparatus according to a first embodiment of the present invention.
Figure 2:
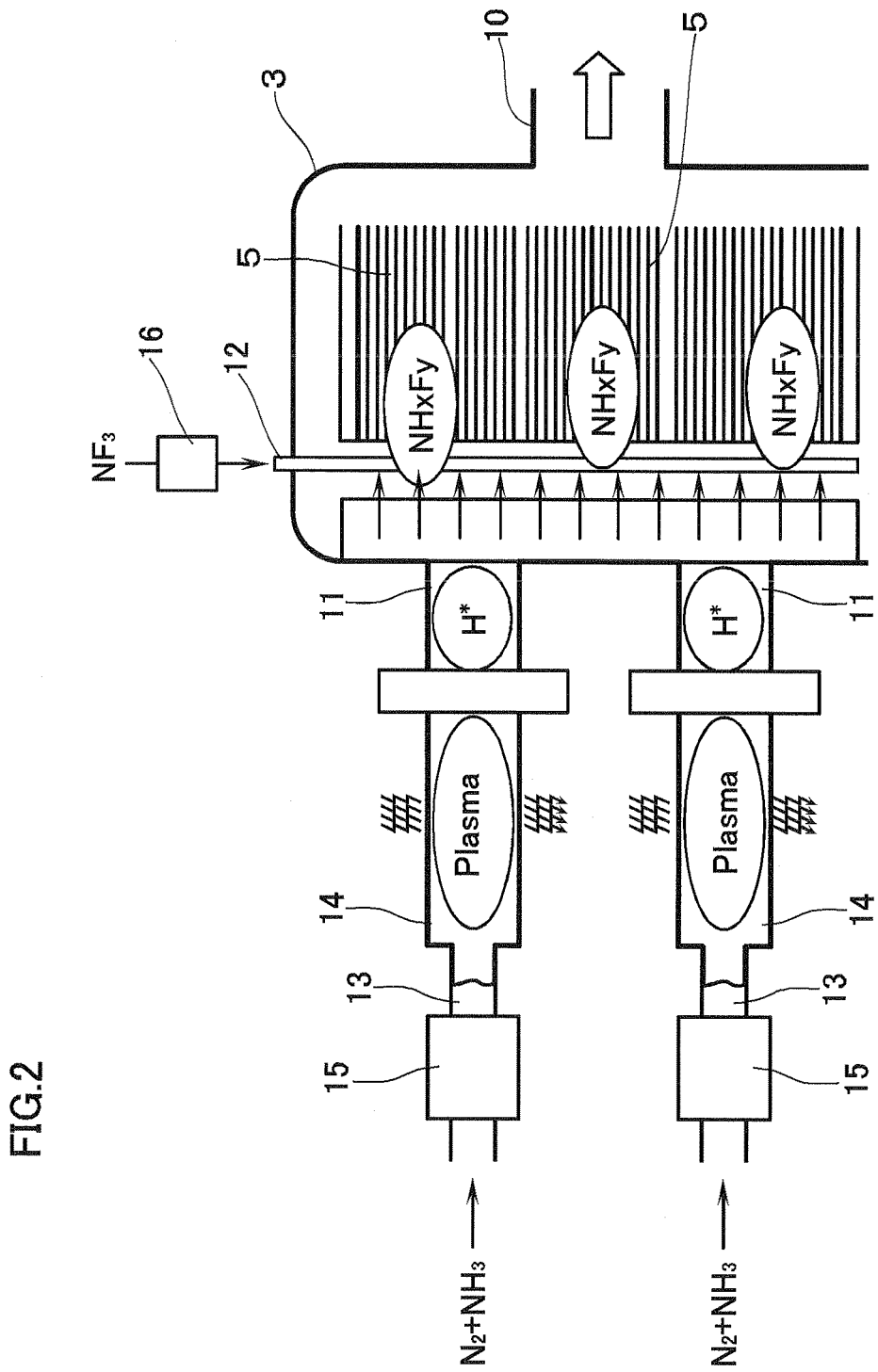
[FIG. 2] is a schematic configuration drawing of a vacuum processing tank.
Figure 3:
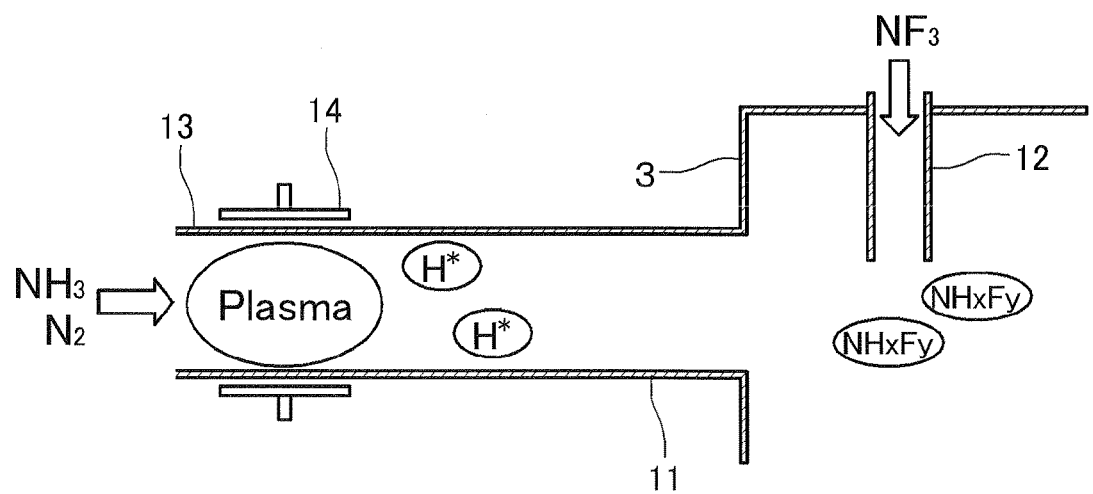
[FIG. 3] is a concept view showing the status of a processing gas in removing a natural oxide film and a by-product.
Figure 4:
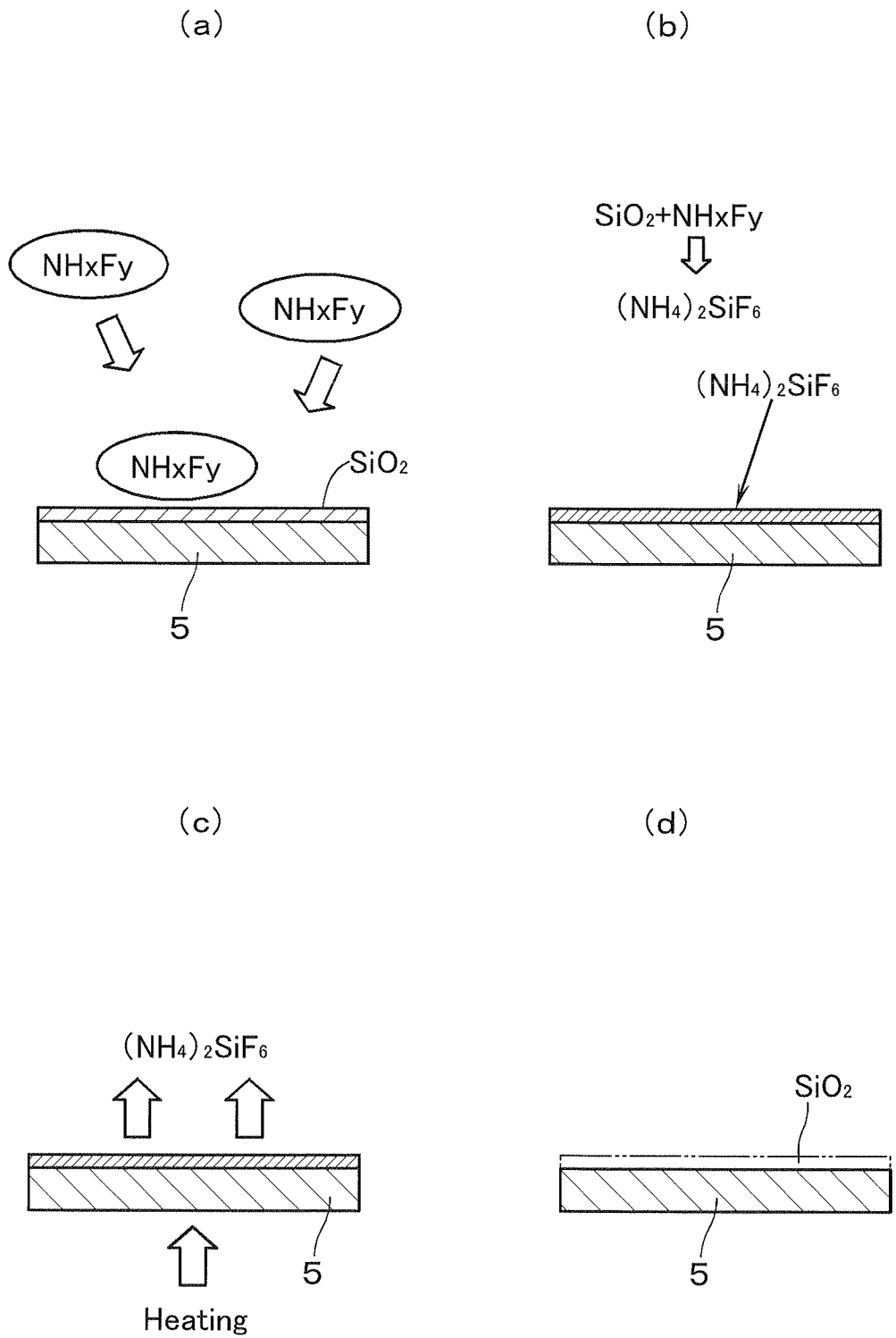
[FIGS. 4(a) to 4(d)] are process explanation drawings showing the removal of the natural oxide film.
Figure 5:
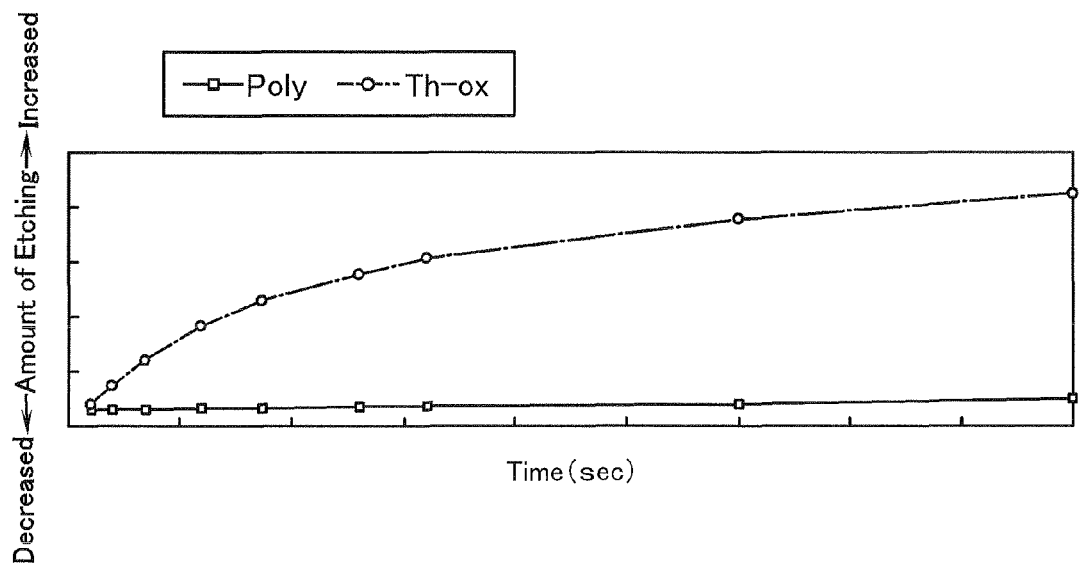
[FIG. 5] is a graph representing the status of removal of the natural oxide film.
Figure 6:
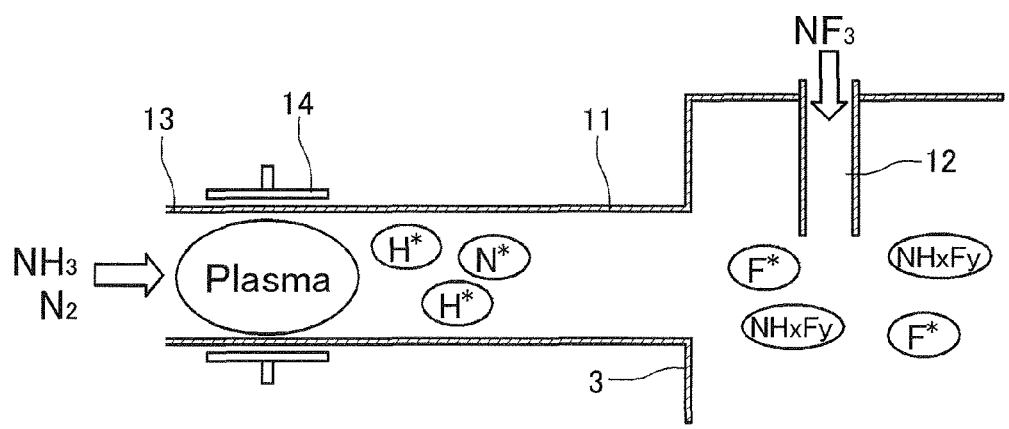
[FIG. 6] is a concept view showing the status of a processing gas in removing a silicon layer.
Figure 8:
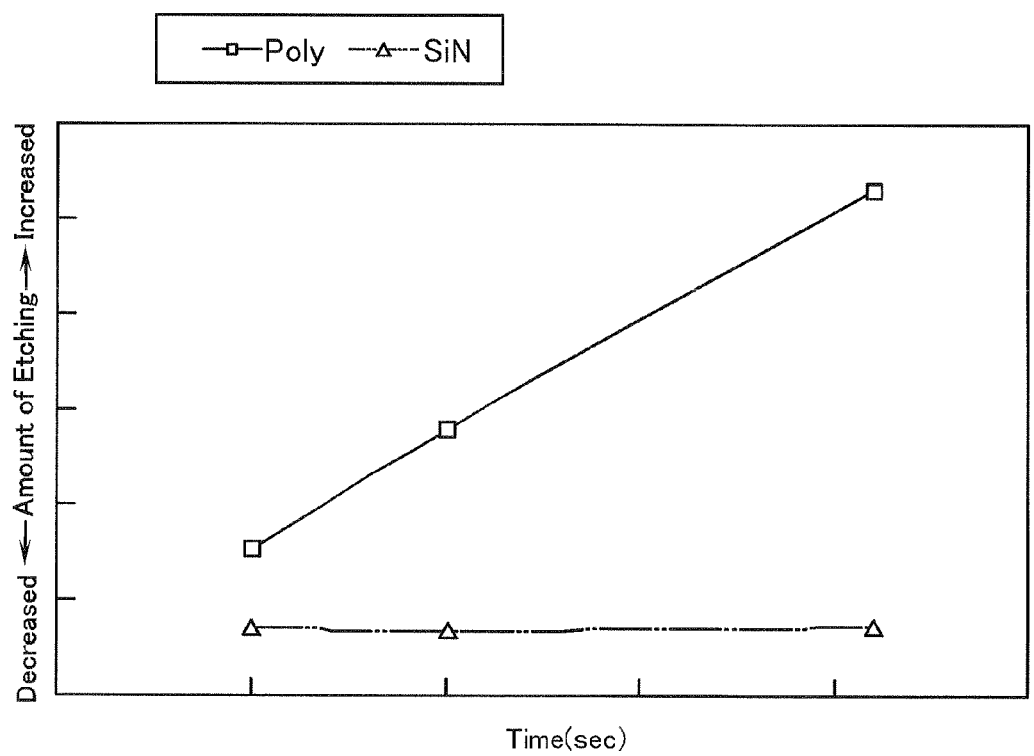
[FIG. 8] is a graph representing the status of removal of the silicon layer.
Figure 10:
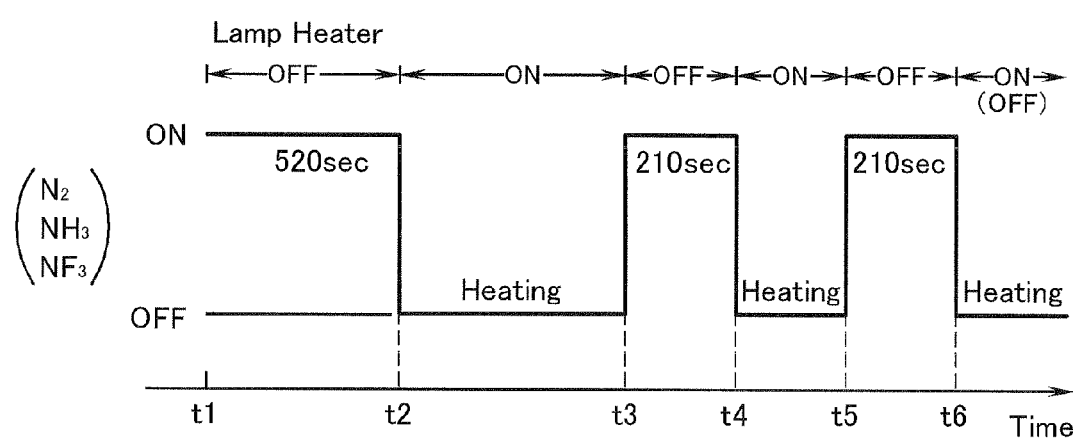
[FIG. 10] is a time-chart representing changes over time in the processing gas for the removal of the natural oxide film and the removal of the silicon layer.
Figure 11:
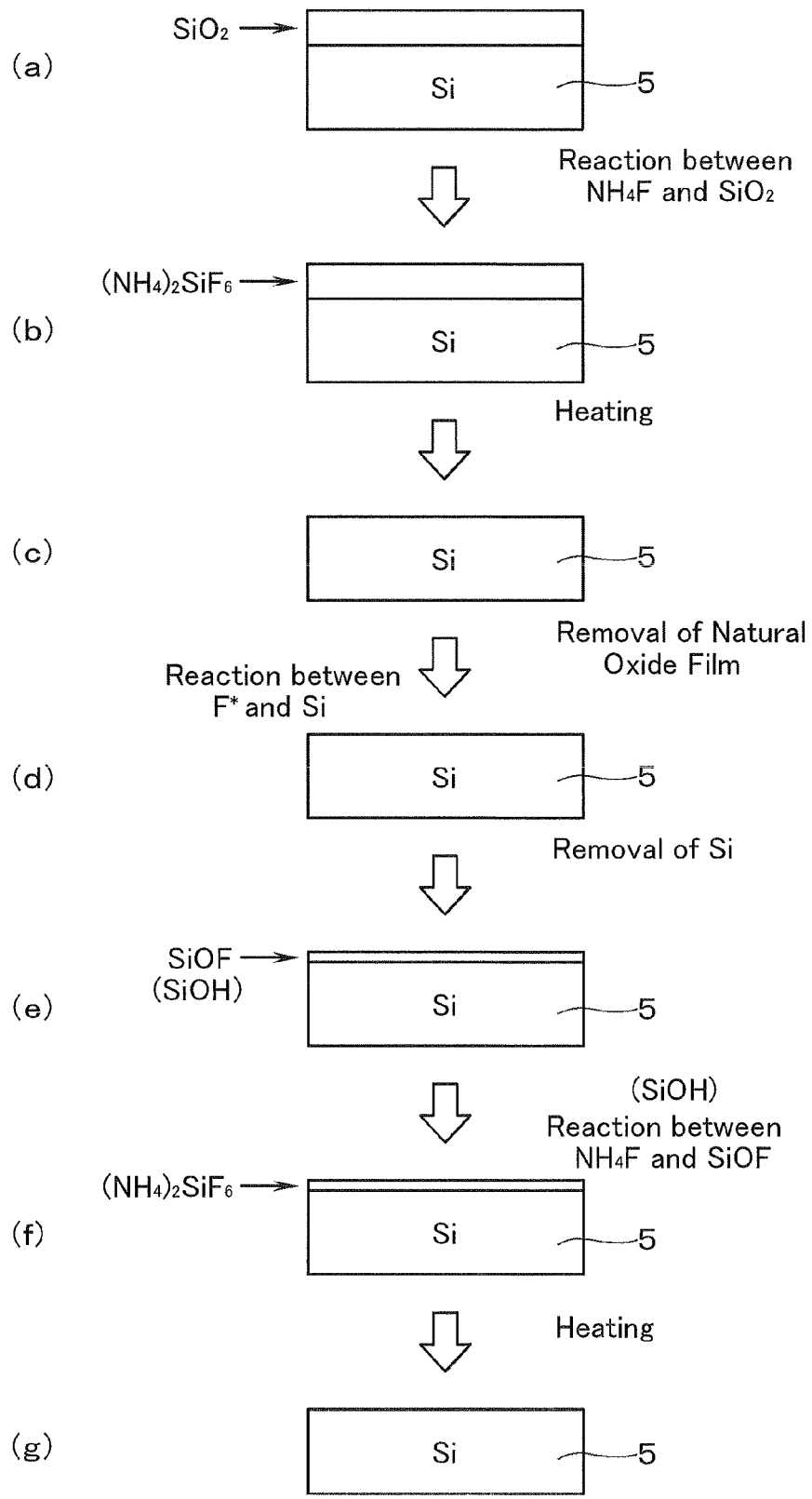
[FIGS. 11(a) to 11(g)] are processing explanation drawings for a silicon substrate.
Figure 12:
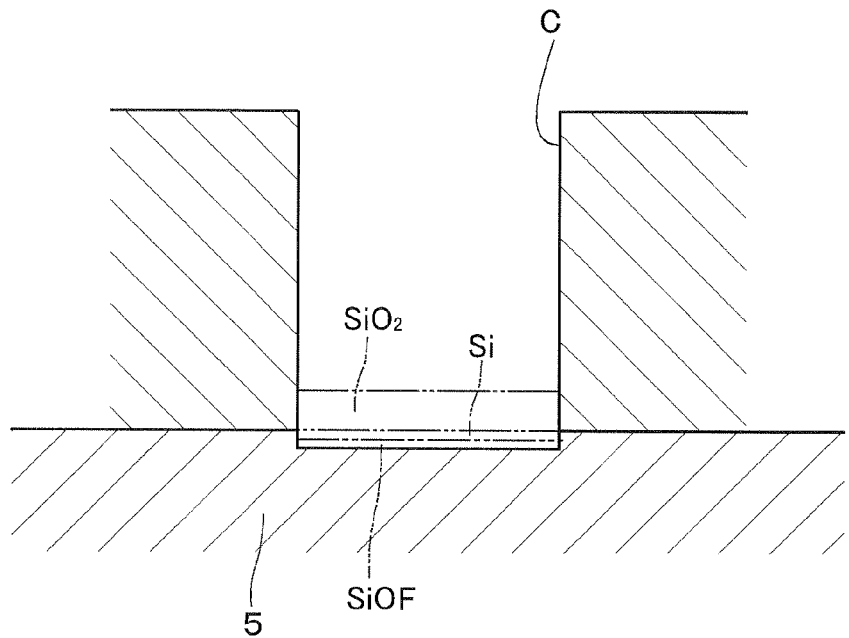
[FIG. 12] is a schematic view showing a concrete use.

FIG. 1 shows a configuration representing the whole of a vacuum processing apparatus according to a first embodiment of the present invention. FIG. 2 shows a configuration representing the outline of a vacuum processing tank. FIG. 3 shows a concept representing the status of a processing gas in removing a natural oxide film and a by-product. FIGS. 4(a) to 4(d) show an explanation for a process for removing the natural oxide film. FIG. 5 shows the status of removal of the natural oxide film. FIG. 6 shows a concept representing the status of a processing gas in removing a silicon layer. FIGS. 7(a) to 7(c) show an explanation for a process for removing the silicon layer. FIG. 8 shows the status of removal of the silicon layer. FIGS. 9(a) to 9(d) show an explanation for a process for removing a by-product. FIG. 10 shows changes over time in the processing gas for the removal of the natural oxide film, the removal of the silicon layer, and the removal of the by-product. FIGS. 11(a) to 11(g) show an explanation for a series of steps for removal of the natural oxide film, removal of the silicon layer, and removal of the by-product. FIG. 12 shows an outline representing a concrete use.

The vacuum processing apparatus of the present invention is an apparatus for removing a natural oxide film of a silicon substrate, allowing F radicals to act on the surface of the silicon substrate deprived of the oxide film, thereby removing a silicon layer of a predetermined thickness to remove oxygen completely, and removing a by-product which has been formed during removal of the silicon layer of the predetermined thickness. With the use of a processing apparatus for removing the natural oxide film, therefore, oxygen on the surface of the substrate can be reliably removed after removal of the natural oxide film, and the by-product which may be formed by oxygen removal can also be removed.

The configuration of the vacuum processing apparatus will be described based on FIGS. 1 and 2.

As shown in FIG. 1, a vacuum processing apparatus (etching apparatus) 1 is equipped with a charge/withdrawal tank 2 connected to a vacuum pumping system, and a vacuum processing tank 3 is provided above the charge/withdrawal tank 2 (processing equipment). A turn table 4 rotatable at a predetermined speed is provided inside the charge/withdrawal tank 2, and a boat 6 for holding a silicon substrate 5 as a substrate is supported on the turntable 4. The boat 6 accommodates a plurality of (e.g., 50) the silicon substrates 5, and the plurality of silicon substrates 5 are arranged parallel to each other at predetermined intervals.

Silicon of the silicon substrate 5 may be any of single crystal silicon and polycrystalline silicon (polysilicon), and will hereinafter be referred to simply as silicon. If the silicon substrate of polysilicon is applied, therefore, etching of a silicon layer to be described later is etching of a polysilicon layer.

A feed screw 7 extending in a vertical direction is provided at an upper part of the charge/withdrawal tank 2, and the turn table 4 is moved upward or downward by driving the feed screw 7. The charge/withdrawal tank 2 and the vacuum processing tank 3 interiorly communicate with each other via a communication port 8, and are atmospherically isolated from each other by a shutter means 9. The opening and closing of the shutter means 9 and the ascent and descent of the turn table 4 result in the delivery and receipt of the boat 6 (silicon substrate 5) between the charge/withdrawal tank 2 and the vacuum processing tank 3.

In the drawing, the numeral 10 denotes a discharge portion for evacuation of the interior of the vacuum processing tank 3.

First introduction ports 11 for introduction of hydrogen in the radical state (H radicals: H*) are provided at two locations in a side part of the vacuum processing tank 3, and a shower nozzle 12 for introduction of $NF_3$ as a second processing gas (processing gas) is provided inside the vacuum processing tank 3. The H radicals H* introduced from the first introduction ports 11 at the two locations and the $NF_3$ introduced from the shower nozzle 12 react with each other to form a precursor $NH_xF_y$ within the vacuum processing tank 3.

As shown in FIG. 2, a first introduction path 13 is connected to the first introduction port 11, and a plasma generation portion 14 is provided in the first introduction path 13. The plasma generation portion 14 brings the processing gas into a plasma state by microwaves. The first introduction path 13 is supplied with $NH_3$ gas (at least one of $NH_3$ gas and $H_2$ gas) and $N_2$ gas as a first processing gas via a flow control means 15. The $NH_3$ gas and the $N_2$ gas are brought into a plasma state in the plasma generation portion 14, whereby H radicals H* are generated. The shower nozzle 12 is supplied with $NF_3$ gas via a flow control means 16.

The first introduction port 11, the first introduction path 13, and the flow control means 15 constitute a first processing gas introduction means, while the shower nozzle 12 and the flow control means 16 constitute a second processing gas introduction means.

The vacuum processing tank 3 is provided with a lamp heater (not shown) as a temperature control means, and the temperature inside the vacuum processing tank 3, namely, the temperature of the silicon substrates 5, is controlled to a predetermined state by the lamp heater. The status of passage of the processing gases by the flow control means 15, 16, and the operating state of the lamp heater are controlled, as appropriate, by a control device (not shown) as a control means.

With the above-mentioned vacuum processing apparatus 1, the boat 6 holding the silicon substrates 5 is carried into the vacuum processing tank 3, and evacuation or vacuum evacuation is performed so that the interior of the vacuum processing tank 3 is in an airtight state and at a predetermined pressure.

Under a command from the control device, the $NH_3$ gas and the $N_2$ gas in the radical state, and the $NF_3$ gas are introduced into the vacuum processing tank 3. A natural oxide film surface (SiO$_2$) of the silicon substrate 5 disposed in an atmosphere in a predetermined vacuum state, and these processing gases are reacted (adsorption reaction at a low temperature) to form a reaction product (a compound of F$_y$ and NH$_x$ {(NH$_4$)$_2$SiF$_6$}). Then, the lamp heater is actuated to control the silicon substrates 5 to a predetermined temperature (heat the silicon substrates 5 to a high temperature), thereby sublimating the reaction product {(NH$_4$)$_2$SiF$_6$} to remove (etch) the natural oxide film on the surface of the silicon substrates 5.

With the arrangement of the silicon substrates 5 deprived of the natural oxide film being maintained, NH$_3$ gas and N$_2$ gas in the radical state and NF$_3$ gas are introduced, as an auxiliary processing gas, into the vacuum processing tank 3 under a command from the control device. That is, the same processing gas as the processing gases used during etching of the natural oxide film is introduced. In this manner, F in the radical state (F radicals: F*), which has been generated in the vacuum processing tank 3, is allowed to act on the surface of the silicon substrate 5, thereby etching a silicon layer of a predetermined thickness.

At this time, NH$_x$F$_y$ is present, along with F radicals: F*, in the vacuum processing tank 3, but in a high temperature atmosphere, NH$_x$F$_y$ does not act on the surface of the silicon substrate 5. Thus, the action of the lamp heater is controlled by the control device, whereby the state of the predetermined temperature during etching of the natural oxide film (e.g., 100° C. to 400° C.) is also maintained during etching of the silicon layer. After the natural oxide film is etched, only the F radicals: F* are allowed to act on the surface of the silicon substrate 5, with the result that the silicon layer of the predetermined thickness can be etched.

Further, in a state where the arrangement of the silicon substrates 5 having the silicon layer of the predetermined thickness is maintained, the processing gas including NH$_3$ gas, N$_2$ gas and NF$_3$ gas is introduced into the vacuum processing tank 3, to cause reaction (adsorption reaction at a low temperature) between by-products (SiOF, SiOH) of the silicon substrates 5 arranged in an atmosphere in a predetermined vacuum state and ammonium fluoride (NH$_4$F) based on the processing gas. This reaction results in the formation of a reaction by-product (a compound of F$_y$ and NH$_x${(NH$_4$)$_2$SiF$_6$}). Then, the lamp heater is actuated to control the silicon substrates 5 to a predetermined temperature (heat the silicon substrates 5 to a high temperature), thereby sublimating the reaction by-product {(NH$_4$)$_2$SiF$_6$} to remove (etch) the by-products on the surface of the silicon substrates 5.

An example has been taken in which NF$_3$ gas and NH$_3$ gas and N$_2$ gas in the radical state are introduced in order to form ammonium fluoride in removing the by-products (SiOF, SiOH). However, it is possible to introduce NF$_3$ gas and H$_2$ gas and N$_2$ gas in the radical state. It is also possible to introduce HF gas and NF$_3$ gas.

Etching of the natural oxide film will be described based on FIGS. 3 to 5.

As shown in FIG. 3, NH$_3$ gas (at least one of NH$_3$ gas and H$_2$ gas) and N$_2$ gas are introduced through the first introduction path 13, H radicals H* are generated in the plasma generation portion, and the H radicals H* are introduced into the vacuum processing tank 3 through the first introduction port 11. Simultaneously, NF$_3$ gas is introduced into the vacuum processing tank 3 through the shower nozzle 12. In the vacuum processing tank 3, the H radicals H* and the NF$_3$ gas are mixed and reacted to form NH$_x$F$_y$.

That is,

As shown in FIG. 4(a), NH$_x$F$_y$ and the natural oxide surface (SiO$_2$) of the silicon substrate 5 react to form (NR$_4$)$_2$SiF$_6$ which is a compound of F$_y$ and NH$_x$, as shown in FIG. 4(b).

That is,

Then, the vacuum processing tank 3 is heated by the lamp heater (for example, to 100° C. to 400° C.) to decompose and sublimate (NH$_4$)$_2$SiF$_6$, thereby removing it from the surface of the silicon substrate 5, as shown in FIG. 4(c).

That is,

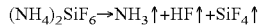

In the above manner, the surface of the silicon substrate 5 is etched to remove (NH$_4$)$_2$SiF$_6$. As a result, the natural oxide film on the surface of the silicon substrate 5 is removed to provide a clean surface, as shown in FIG. 4(d). At this time, the natural oxide film increases in the amount of etching in accordance with the etching time, as indicated by circles (○) in FIG. 5, while the silicon layer scarcely changes in the amount of etching even when the etching time is long, as indicated by squares (□) in FIG. 5. These findings show that the silicon layer has not been etched.

With the arrangement of the silicon substrates 5 deprived of the natural oxide film being maintained, that is, in the same vacuum processing tank 3, the surface of the silicon substrate 5 (silicon layer) having the natural oxide film removed therefrom is etched. Consequently, oxygen on the silicon surface rendered the interface with the oxide film, for example, oxygen likely to exist in the spaces of the metal lattice of silicon, is removed, whereby the silicon substrate 5 having oxygen reliably removed from the surface can be obtained. Moreover, the silicon layer is etched by the apparatus for etching the natural oxide film. Thus, oxidation or the like due to transportation does not occur, so that the silicon substrate 5 having high surface cleanliness can be obtained by very simple processing.

Etching of the silicon layer after removal of the natural oxide film will be described based on FIG. 6 to FIG. 8.

As shown in FIG. 6, NH$_3$ gas (at least one of NH$_3$ gas and H$_2$ gas) and N$_2$ gas are introduced through the first introduction path 13 to generate H radicals H* and N radicals N* in the plasma generation portion 14, whereafter the H radicals H* and the N radicals N* are introduced into the vacuum processing tank 3 through the first introduction port 11. Simultaneously, NF$_3$ gas is introduced into the vacuum processing tank 3 through the shower nozzle 12. In the vacuum processing tank 3, the H radicals H* and the NF$_3$ gas are mixed and reacted to form a precursor NH$_x$F$_y$, and the N radicals N* and the NF$_3$ gas are mixed and reacted to generate F radicals F*.

That is,

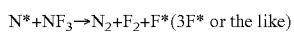

As shown in FIG. 7(a), the interior of the vacuum processing tank 3 is maintained in a heating atmosphere in order to remove the natural oxide film, in other words, decompose and sublimate (NH$_4$)$_2$SiF$_6$. Thus, the precursor NH$_x$F$_y$ does not react with the surface of the silicon substrate 5 (silicon surface) maintained at a high temperature. Instead, as shown in FIG. 7(b), the F radicals F* act on the surface of the silicon substrate 5, etching the surface.

That is,

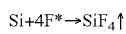

As a result, oxygen on the silicon surface as the interface with the natural oxide film is removed, and the silicon substrate 5 having oxygen reliably removed from the surface can be obtained, as shown in FIG. 7(c). At this time, the silicon layer increases in the amount of etching in accordance with the etching time, as indicated by squares (□) in FIG. 8, while a layer other than the silicon layer (for example, SiN) scarcely changes in the amount of etching even when the etching time is long, as indicated by triangles (Δ) in FIG. 8. These findings show that only the silicon layer is etched.

When the F radicals F* are allowed to act on the surface of the silicon substrate 5 to etch the surface, by-products (SiOF, SiOH) are expected to be formed on the surface of the silicon substrate 5. Thus, with the arrangement of the silicon substrates 5 being maintained, that is, in the same vacuum processing tank 3, the by-products (SiOF, SiOH) on the surface of the silicon substrate 5 having the silicon layer of a predetermined thickness etched away are removed. Hence, oxygen on the surface of the silicon substrate 5, including the by-products which may be formed during removal of oxygen, can be reliably removed, with the use of the processing apparatus for removing the natural oxide film.

The situation where the by-products (SiOF, SiOH) on the surface of the silicon substrate 5 having the silicon layer of the predetermined thickness etched away are removed will be described based on FIG. 3 and FIGS. 9(a) to 9(d).

Introduction of a processing gas is the same as that when removing the natural oxide film (FIG. 3). As shown in FIG. 3, $NH_3$ gas (at least one of $NH_3$ gas and $H_2$ gas) and $N_2$ gas are introduced through the first introduction path 13, H radicals H* are generated in the plasma generation portion, and the H radicals H* are introduced into the vacuum processing tank 3 through the first introduction port 11. Simultaneously, $NF_3$ gas is introduced into the vacuum processing tank 3 through the shower nozzle 12. In the vacuum processing tank 3, the H radicals H* and the $NF_3$ gas are mixed and reacted to form $NH_xF_y$.

That is,

As shown in FIG. 9(a), the $NH_xF_y$ and the by-products (SiOF, SiOH) on the surface of the silicon substrate 5 react to form $(NH_4)_2SiF_6$ which is a compound of $F_y$ and $NH_x$, as shown in FIG. 9(b).

That is,

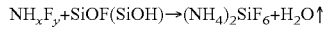

Then, the vacuum processing tank 3 is heated by the lamp heater (for example, to 100° C. to 400° C.) to decompose and sublimate $(NH_4)_2SiF_6$, thereby removing it from the surface of the silicon substrate 5, as shown in FIG. 9(c).

That is,

In this manner, the surface of the silicon substrate 5 is etched to remove $(NH_4)_2SiF_6$. By so doing, there is provided a very clean surface of the silicon substrate 5, from which the natural oxide film has been removed and oxygen, including the by-products (SiOF, SiOH), has been removed, as shown in FIG. 9(d).

The status of introduction of the processing gases {$NH_3$ gas (at least one of $NH_3$ gas and $H_2$ gas) and $N_2$ gas, $NF_3$ gas} for the etching of the natural oxide film, the etching of the silicon layer, and the etching of the by-products, mentioned above, will be described based on FIG. 10. The status of a series of steps on these occasions is shown in FIGS. 11(a) to 11(g).

During the period from a time t1 until a time t2 (for example, 520 seconds), the processing gases are introduced (ON), while the lamp heater is turned off, whereby processing for reacting the precursor $NH_xF_y$ with the natural oxide film $SiO_2$ is carried out (see FIGS. 4(a), 4(b), FIGS. 11(a), 11(b)). During the period from the time t2 until a time t3, the processing gases are stopped (OFF), while the lamp heater is turned on, whereby a compound $(NH_4)_2SiF_6$ is decomposed and sublimated, with the result that the natural oxide film $SiO_2$ is etched away (see FIGS. 4(c), 4(d), FIG. 11(c)).

Then, during the period from the time t3 until a time t4 (for example, 50 to 210 seconds), the processing gases are introduced again (ON), while the lamp heater is turned off, whereby F radicals F* are generated, The system is held in a heating atmosphere and, during the period from the time t4 until a time t5, the lamp heater is turned on, so that the silicon layer is etched by the F radicals F* (see FIGS. 7(a), 7(b), 7(c), FIG. 11(d)).

Further, during the period from the time t5 until a time t6 (for example, 50 to 210 seconds), the processing gases are introduced (ON), while the lamp heater is turned off as appropriate, whereby processing for reacting the precursor $NH_xF_y$ with the by-products (SiOF, SiOH) is carried out (see FIGS. 9(a), 9(b), FIGS. 11(e), 11(f)). After the time t6, the processing gases are stopped (OFF), while the lamp heater is turned on and off so as to maintain the temperature, whereby the compound $(NH_4)_2SiF_6$ is decomposed and sublimated, with the result that the by-products (SiOF, SiOH) are etched away (see FIGS. 9(c), 9(d), FIG. 11(g)).

At the points in time, t3 and t5, it is also possible to carry out a cooling step for cooling the interior of the processing tank.

In the first embodiment, as described above, the removal of the natural oxide film, the removal of the silicon layer having the natural oxide film removed therefrom, and the removal of the by-products formed by the removal of the silicon layer can be performed within the same vacuum processing tank 3. Using the vacuum processing apparatus 1 for removing the natural oxide film, therefore, oxygen at the interface of the silicon substrate 5 after removal of the natural oxide film can be reliably removed in a short time by simple control. Furthermore, the by-products which may be formed by the removal of oxygen can also be removed. Hence, the simple vacuum processing apparatus 1 and processing method make it possible to obtain the silicon substrate 5 having a surface with very high performance.

The removal of the natural oxide film, and the removal of the silicon layer having the natural oxide film removed therefrom, which are described above, are used in cleaning the bottom surface of a contact hole C of a semiconductor substrate, as shown in FIG. 12. That is, the natural oxide film in the contact hole C is removed by the sublimation of $(NH_4)_2SiF_6$, whereafter the silicon layer is removed in succession. Further, the by-products (SiOF, SiOH) formed during removal of the silicon layer are removed by the sublimation of $(NH_4)_2SiF_6$. Consequently, there can be formed the contact hole C having a bottom surface reliably deprived of oxygen, including the by-products. Then, a metal for wiring is stacked, whereupon wiring with very low resistance can be achieved.

Figure 13:
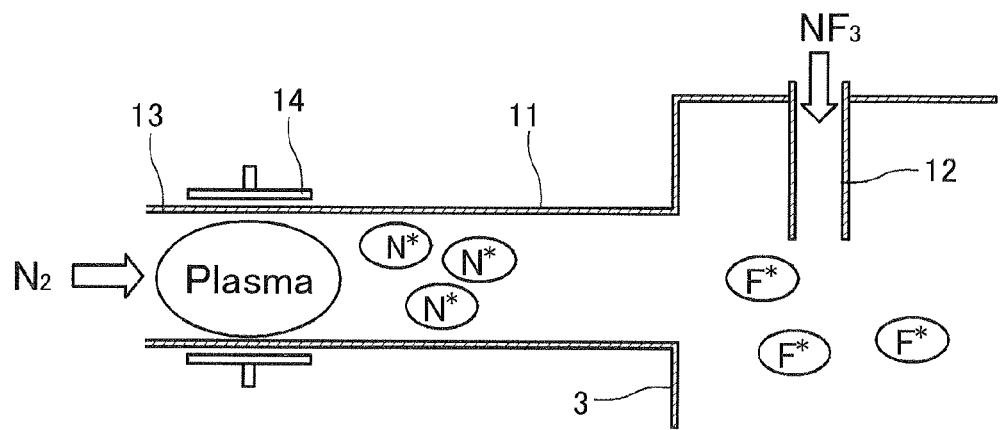
[FIG. 13] is a concept view showing the status of a processing gas in removing a silicon layer.

A second embodiment of an etching method (vacuum processing method) for the silicon layer after removal of the natural oxide film will be described based on FIG. 13 and FIGS. 14(a) to 14(c). FIG. 13 shows a concept representing the status of processing gases in removing the silicon layer in the second embodiment of the present invention. FIGS. 14(a) to 14(c) show a process explanation for the removal of the silicon layer in the second embodiment of the present invention. The configuration of the vacuum processing apparatus 1 is the same as that in the first embodiment, and thus an explanation for this configuration is omitted.

The etching method according to the second embodiment uses $NH_3$ gas (at least one of $NH_3$ gas and $H_2$ gas) and $N_2$ gas and $NF_3$ gas, respectively, as a first processing gas and a second processing gas (processing gases) in removing the natural oxide film. In removing the silicon layer, this etching method stops $NH_3$ gas, but uses $N_2$ and $NF_3$, as an auxiliary processing gas. That is, in removing the silicon layer, F radicals F* are allowed to act on the silicon substrate 5, without the precursor $NH_xF_y$ being formed within the vacuum processing apparatus 1. Thus, the removal of the silicon layer will be described below.

As shown in FIG. 13, $N_2$ gas is introduced through the first introduction path 13 {$NH_3$ gas (at least one of $NH_3$ gas and $H_2$ gas) is stopped} to generate N radicals N* in the plasma generation portion 14, whereafter the N radicals N* are introduced into the vacuum processing tank 3 through the first introduction port 11. Simultaneously, $NF_3$ gas is introduced into the vacuum processing tank 3 through the shower nozzle 12. In the vacuum processing tank 3, the N radicals N* and the $NF_3$ gas are mixed and reacted to generate F radicals F*.

That is,

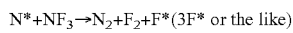
N*+NF$_3$→N$_2$+F$_2$+F*(3F* or the like)

As shown in FIG. 14(*a*), the F radicals F* are introduced into the vacuum processing tank 3 and, as shown in FIG. 14(*b*), the F radicals F* act on the surface of the silicon substrate 5, etching the surface.

That is,

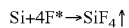
Si+4F*→SiF$_4$↑

As a result, oxygen on the silicon surface rendered the interface with the natural oxide film is removed, and the silicon substrate 5 having oxygen reliably removed from the surface can be obtained, as shown in FIG. 14(*c*). Since $NH_3$ gas (at least one of $NH_3$ gas and $H_2$ gas) is stopped, moreover, the precursor $NH_xF_y$ is not formed. Even at a relatively low temperature, the F radicals F* can be allowed to act on the surface of the silicon substrate 5. In a short time, therefore, the etching of the silicon layer can be performed.

In the second embodiment, as described above, the removal of the natural oxide film, and the removal of the silicon layer having the natural oxide film removed therefrom can be performed within the same vacuum processing tank 3, in the same manner as in the first embodiment. In this manner, oxygen at the interface of the silicon substrate 5 after removal of the natural oxide film can be reliably removed in a short time by simple control. Hence, the simple vacuum processing apparatus 1 and processing method make it possible to obtain the silicon substrate 5 having a surface with very high performance.

With each of the above-mentioned embodiments, $NH_3$ gas (at least one of $NH_3$ gas and $H_2$ gas) and $N_2$ gas and $NF_3$ gas are introduced from separate gas introduction means at the time of etching of the silicon layer. However, this is not limitative, and all the gases may be introduced from the same gas introduction means having the plasma generation portion. In this case, plasma can directly be applied to $NF_3$ gas to generate F radicals.

Figure 15:
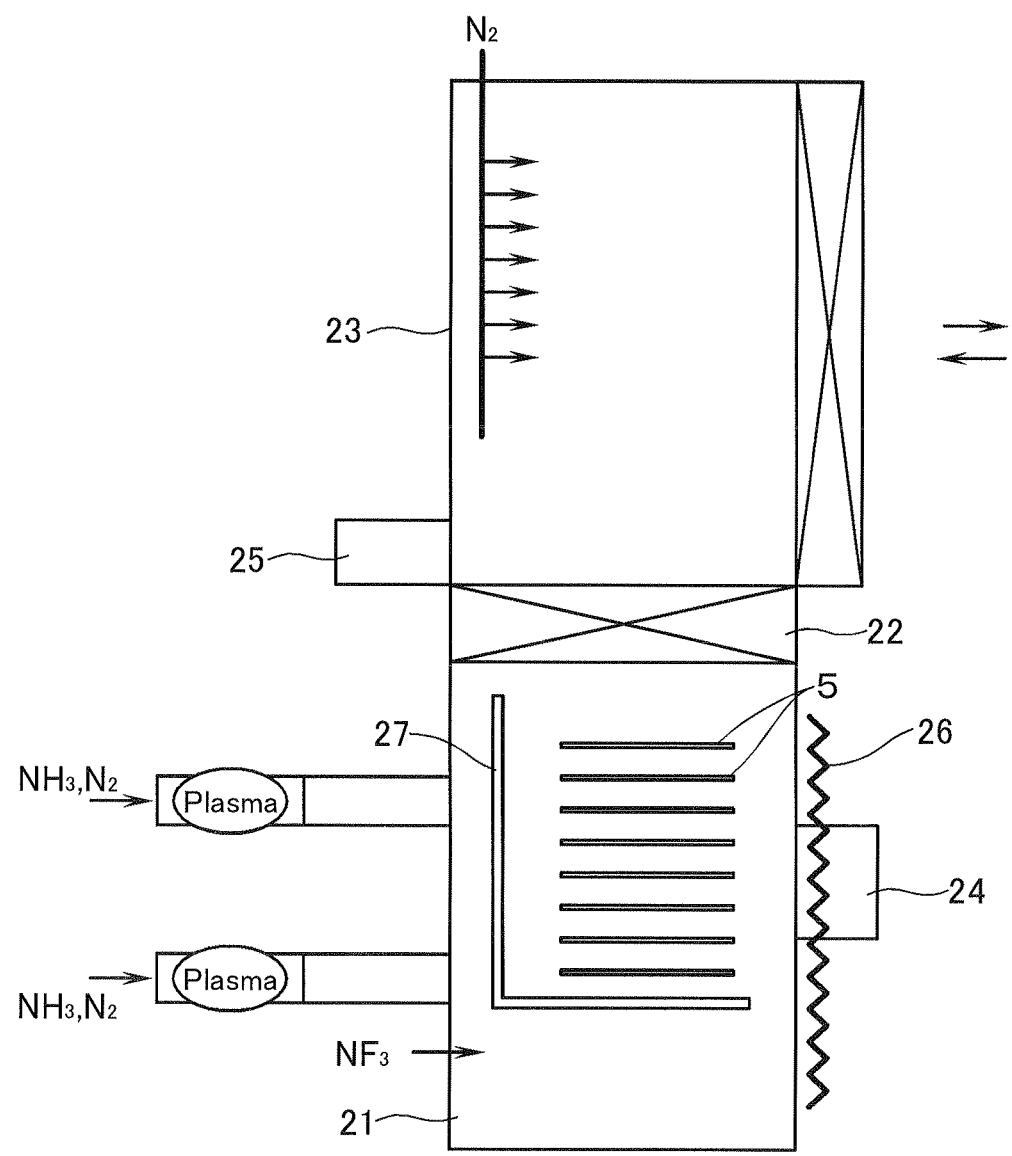
[FIG. 15] is an overall configuration drawing of a vacuum processing apparatus according to another embodiment of the present invention.

Another example of an apparatus for performing batch processing will be described based on FIG. 15. FIG. 15 shows an overall configuration representing the outline of a vacuum processing apparatus according to another embodiment of the present invention.

A processing gas in a plasma state and $NF_3$ are introduced into a vacuum processing chamber 21 (etching chamber), which is processing equipment, and a cooling chamber 23 also serving as processing equipment is provided above the vacuum processing chamber 21 via a valve 22. An inert gas ($N_2$ gas) is introduced into the cooling chamber 23 to cool the interior of the chamber. The vacuum processing chamber 21 and the cooling chamber 23 are brought into a predetermined vacuum state by vacuum systems 24, 25. The vacuum processing chamber 21 is provided with a heater 26, and the interior of the vacuum processing chamber 21 is controlled to a desired temperature by the heater 26.

The vacuum processing chamber 21 is equipped with an elevating mechanism 27 for raising and lowering a plurality of silicon substrates 5 held in a boat 6. By linking the opening and closing of the valve 22 to the elevating mechanism 27, the plurality of silicon substrates 5 can be moved between the vacuum processing chamber 21 and the cooling chamber 23. The cooling chamber 23 is connected to a load lock chamber (not shown) via the valve 22, and the plurality of silicon substrates 5 held in the boat 6 are conveyed (carried in or carried out) by the opening or closing of the valve 22.

With the above-described vacuum processing apparatus 1, removal of a natural oxide film, removal of a silicon layer, and removal of by-products, with respect to the silicon substrate 5 are performed in the vacuum processing chamber 21. Cooling for temperature control is carried out in the cooling chamber 23. Let it be assumed, for example, that a cooling step for cooling the interior of the processing tank is performed at the time t3 and the time t5, shown in FIG. 10, in the aforementioned series of steps. In this case, the opening and closing of the valve 22 are linked to the elevating mechanism 27 to raise or lower the plurality of silicon substrates 5 held in the boat 6 so that cooling takes place in the cooling chamber 23.

By providing the cooling chamber 23, temperature control for performing the removal of the natural oxide film, the removal of the silicon layer, and the removal of the by-products in a series of steps can be exercised in a short time. Thus, an increase in productivity can be achieved.

Figure 16:
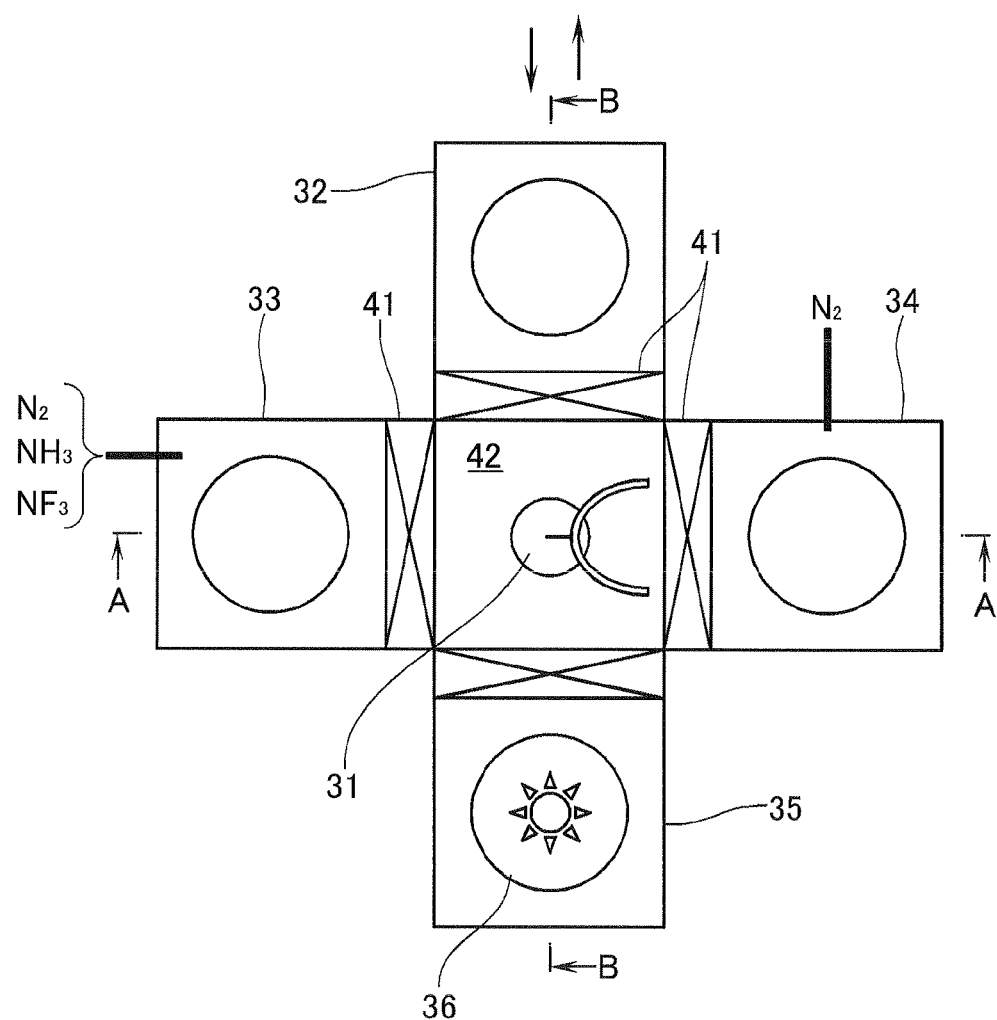
[FIG. 16] is an overall configuration drawing of a vacuum processing apparatus according to still another embodiment of the present invention.
Figure 17:
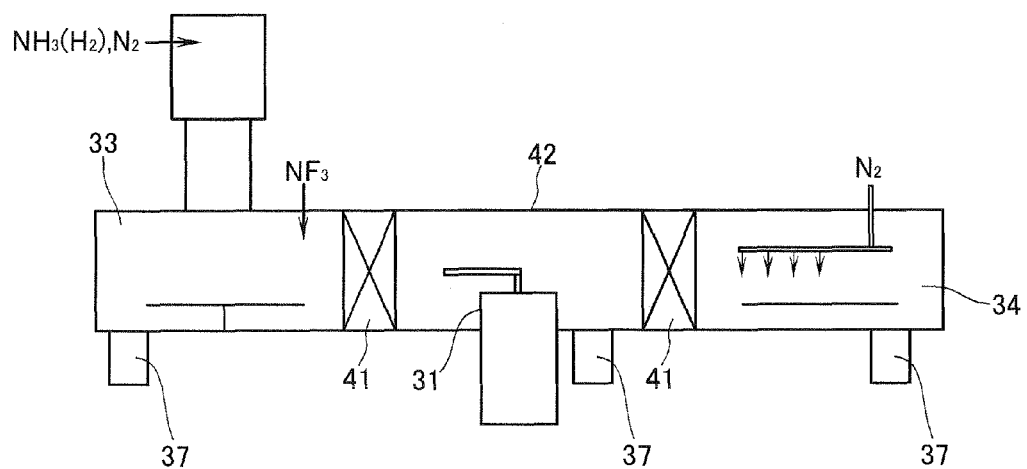
[FIG. 17] is a view along line A-A in FIG. 16.
Figure 18:
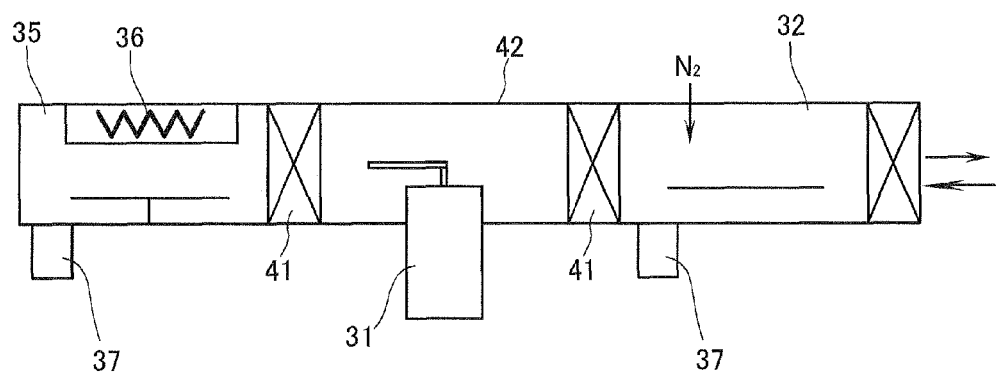
[FIG. 18] is a view along line B-B in FIG. 16.

The present invention can also be carried out using a so-called single wafer processing apparatus by which substrates are fed, one by one, into the processing chamber. An example of the single wafer processing apparatus will be described based on FIG. 16 to FIG. 18. FIG. 16 shows an overall configuration representing the outline of a vacuum processing apparatus according to still another embodiment of the present invention. FIG. 17 and FIG. 18 show views along line A-A and line B-B, respectively, in FIG. 16.

As shown in the drawings, a transportation chamber 42 equipped with a conveying robot 31 is provided, and a load lock chamber 32, a vacuum processing chamber (etching chamber) 33, a heating chamber 35, and a cooling chamber 34 are disposed around the transportation chamber 42 via valves 41. A processing gas in a plasma state and $NF_3$ are introduced into the vacuum processing chamber 33, and the heating chamber 35 is provided with a heater 36. An inert gas ($N_2$ gas) is introduced into the cooling chamber 34 to cool the interior of the chamber.

A silicon substrate before processing is carried into the load lock chamber 32, and the silicon substrate which has finished processing is carried out of the load lock chamber 32. The action of the conveying robot 31 and the opening and closing of the valve 41 are controlled in an interlocked manner, whereby the silicon substrate is transported, as appropriate, to the vacuum processing chamber 33, the heating chamber 35, and the cooling chamber 34, and carried, as appropriate, out of the vacuum processing chamber 33, the heating chamber 35, and the cooling chamber 34. With the single silicon substrate being disposed within each of the plurality of processing chambers, predetermined processing is performed.

With the above-described vacuum processing apparatus, removal of the natural oxide film, removal of the silicon layer, and removal of the by-products, with respect to the silicon substrate, are performed in the vacuum processing chamber 33. Heating for temperature control is carried out in the heating chamber 35, whereas cooling for temperature control is carried out in the cooling chamber 34. When the silicon layer is removed, F radicals F* are generated. Thus, it is also possible to add the vacuum processing chamber 33 for performing the removal of the silicon layer.

As noted above, the plurality of processing chambers are provided, and the silicon substrates are processed, one by one, in each processing chamber. If removal of the natural oxide film, removal of the silicon layer, and removal of the by-products are performed in a series of steps, therefore, uniform processing can be carried out, and products with high performance can be obtained.

In the above-mentioned embodiments, the use of the same gases in removing the natural oxide film and the by-products has been described. However, different gases may be used. For example, an anhydrous hydrofluoric acid gas (AHF) and $N_2$ gas and $N_2$ gas saturated with ethanol ($C_2H_5OH$) or methanol ($CH_3OH$) may be used as gases for removing the by-products.

In this case, an anhydrous hydrofluoric acid gas (AHF) and $N_2$ gas are introduced into the vacuum processing chamber from the same piping through a mass flow controller. $N_2$ gas saturated with ethanol ($C_2H_5OH$) or methanol ($CH_3OH$) by bubbling ethanol ($C_2H_5OH$) or methanol ($CH_3OH$) inside a container is introduced from different piping.

Within the vacuum processing chamber, by-products (e.g., SiOF) on the surface of the silicon substrate can be removed by the reaction between the anhydrous hydrofluoric acid gas (AHF) and the $N_2$ gas saturated with ethanol ($C_2H_5OH$) or methanol ($CH_3OH$).

Concretely, the reaction between the anhydrous hydrofluoric acid gas (AHF) and the ethanol ($C_2H_5OH$) or methanol ($CH_3OH$) generates $HF_2^-$.

That is, $$C_2H_5OH + 2HF \rightarrow C_2H_5OH_2^+ + HF_2^-$$

$$CH_3OH + 2HF \rightarrow CH_3OH_2^+ + HF_2^-$$

The resulting $HF_2^-$ contributes to the etching of by-products (e.g., SiOF). $SiF_4$ and $H_2O$, which have been formed by the etching of the by-products, are well compatible with ethanol ($C_2H_5OH$) or methanol ($CH_3OH$), and are discharged together with an excess ethanol ($C_2H_5OH$) or methanol ($CH_3OH$) vapor.

In the above-described embodiments, the use of so-called dry etching for removal of the by-products with the use of gases has been described. However, this is not limitative, and the wet etching process may be used to remove the by-products. In this case, the removal of the by-products is carried out, for example, by transporting the silicon substrate into a different processing chamber after removal of the silicon layer, and immersing the substrate within a container filled with hydrogen fluoride (HF). By this processing, by-products (e.g., SiOF) on the surface of the silicon substrate can be removed.

INDUSTRIAL APPLICABILITY

The present invention can be utilized in the industrial field of a vacuum processing method and a vacuum processing apparatus for performing etching in processing equipment in a vacuum state.

DESCRIPTION OF THE NUMERALS

1 Vacuum processing apparatus
2 Charge/withdrawal tank
3 Vacuum processing tank
4 Turn table
5 Silicon substrate
6 Boat
7 Feed screw
8 Communication port
9 Shutter means
10 Discharge portion
11 First introduction port
12 Shower nozzle
13 First introduction path
14 Plasma generation portion
15, 16 Flow control means

The invention claimed is:
1. A vacuum processing method, comprising:
introducing a processing gas to react the processing gas with an oxidized surface of a silicon substrate disposed in an atmosphere in a predetermined vacuum state, thereby forming a reaction product, and controlling the silicon substrate to a predetermined temperature to sublimate the reaction product and remove an oxide film on a surface of the silicon substrate;
in a state where arrangement of the silicon substrate having the oxide film removed therefrom is maintained, introducing an auxiliary processing gas to allow F radicals to act on the surface of the silicon substrate, thereby removing a silicon layer of a predetermined thickness; and
after removing the silicon layer, removing a by-product on the surface of the silicon substrate which has been formed during removal of the silicon layer.
2. The vacuum processing method according to claim 1, further comprising
introducing the processing gas to react the processing gas with the by-product on the surface of the silicon substrate having the silicon layer removed therefrom, thereby forming a reaction by-product, and then controlling the silicon substrate to a predetermined temperature to sublimate the reaction by-product and remove the by-product on the surface of the silicon substrate.
3. The vacuum processing method according to claim 2, further comprising
removing the by-product on the surface of the silicon substrate, while maintaining arrangement of the silicon substrate having the silicon layer removed therefrom.
4. The vacuum processing method according to claim 2, wherein
the processing gas is at least one of $NH_3$ and $H_2$, $N_2$, and $NF_3$,
the reaction product and the reaction by-product are sublimated in an atmosphere at 100° C. to 400° C., and
the processing gas is introduced, or $N_2$ and $NF_3$ are introduced, as the auxiliary processing gas to allow the F radicals to act on the surface of the silicon substrate.

5. The vacuum processing method according to claim 4, wherein
the auxiliary processing gas is introduced from identical gas introduction means.

6. The vacuum processing method according to claim 1, wherein
the by-product on the surface of the silicon substrate is removed using an anhydrous hydrofluoric acid gas (AHF), $N_2$ gas, and $N_2$ gas saturated with ethanol ($C_2H_5OH$) or methanol ($CH_3OH$).

7. The vacuum processing method according to claim 1, wherein
after the silicon layer is removed, the by-product on the surface of the silicon substrate is removed using a wet etching process.

8. The vacuum processing method according to claim 7, wherein
hydrogen fluoride (HF) is used as a solution for the wet etching process.

9. The vacuum processing method according to claim 1, wherein
the by-product is SiOF.

10. A vacuum processing method, comprising:
introducing at least one of $NH_3$ and $H_2$, $N_2$, and $NF_3$, as a processing gas to react the processing gas with an oxidized surface of a silicon substrate disposed in an atmosphere in a predetermined vacuum state, thereby forming a reaction product;
controlling the silicon substrate to a predetermined temperature to sublimate the reaction product and remove an oxide film on a surface of the silicon substrate and, in a state where arrangement of the silicon substrate having the oxide film removed therefrom is maintained, introducing the processing gas, or $N_2$ and $NF_3$, as an auxiliary processing gas through gas introduction means identical with that for the processing gas to allow F radicals to act on the surface of the silicon substrate, thereby removing a silicon layer of a predetermined thickness; and then
in a state where the arrangement of the silicon substrate is maintained, removing a by-product on the surface of the silicon substrate, which has been formed during removal of the silicon layer, by controlling the silicon substrate to 100° C. to 400° C.

\* \* \* \* \*